United States Patent [19]

Yasuoka

[11] Patent Number: 5,017,996
[45] Date of Patent: May 21, 1991

[54] SEMICONDUCTOR DEVICE AND PRODUCTION METHOD THEREOF

[75] Inventor: Hideki Yasuoka, Takasaki, Japan

[73] Assignee: Hitachi, Ltd., Tokyo, Japan

[21] Appl. No.: 358,525

[22] Filed: May 30, 1989

Related U.S. Application Data

[63] Continuation of Ser. No. 101,150, Sep. 25, 1987, abandoned.

[30] Foreign Application Priority Data

Sep. 26, 1986 [JP] Japan ................ 21-225944

[51] Int. Cl.$^5$ .............. H01L 27/02; H01L 29/72; H01L 29/40; H01L 29/06
[52] U.S. Cl. ........................ 357/43; 357/42; 357/34; 357/53; 357/23.11
[58] Field of Search ............... 357/43, 42, 34, 53, 357/35, 23.11

[56] References Cited

U.S. PATENT DOCUMENTS

| | | | |
|---|---|---|---|
| 4,047,217 | 9/1977 | McCaffrey | 357/43 |
| 4,484,388 | 11/1984 | Iwasaki | 29/571 |
| 4,510,676 | 4/1985 | Anantha | 357/35 |
| 4,529,456 | 7/1985 | Anzai | 148/186 |
| 4,574,467 | 3/1986 | Halfacre | 357/52 |
| 4,602,267 | 7/1986 | Shirato | 357/43 |
| 4,605,948 | 8/1986 | Martinelli | 357/52 |
| 4,613,887 | 9/1986 | Fukuda | 357/43 |
| 4,628,341 | 12/1986 | Thomas | 357/43 |
| 4,662,057 | 5/1987 | Yasuoka | 29/571 |

FOREIGN PATENT DOCUMENTS 0110313 6/1984 European Pat. Off. .

OTHER PUBLICATIONS

Nikkei Electronics, Jun. 20, 1983, pp. 179-207; published by Nikkei-McGraw-Hill Co.
IBM Technical Disclosure Bulletin; vol. 28, #9, pp. 3813-3815, Feb. 1986.

Primary Examiner—Mark Prenty
Attorney, Agent, or Firm—Antonelli, Terry, Stout & Kraus

[57] ABSTRACT

This invention relates to a BiMOS IC, such as BiCMOS IC, and production method thereof. The present invention forms an impurity layer for preventing field concentration in a bipolar transistor by the same or a different process step than that for forming a diffusion layer of a MOS FET (such as a p-layer for the channel stopper), in order to improve the breakdown voltage of the bipolar transistor (such as a p-layer as the base of a bipolar npn transistor) of a BiMOS IC having the bipolar transistor and MOS FET formed on the same semiconductor substrate. Thus, the invention can provide a BiMOS IC having an improved breakdown voltage of the bipolar semiconductor device portion without drastically changing the production process of the BiMOS IC.

31 Claims, 3 Drawing Sheets

SEMICONDUCTOR DEVICE AND PRODUCTION METHOD THEREOF

This application is a continuation of application Ser. No. 101,150, filed Sept. 25, 1987 and now abandoned.

BACKGROUND OF THE INVENTION

This invention relates to a semiconductor device and a production method thereof. More particularly, the present invention relates to a technique of improving the breakdown voltage of a semiconductor device which incorporates a bipolar IC and a CMOS (Complementary Metal Oxide Semiconductor Field Effect Transistor) IC in one semiconductor chip (hereinafter referred to as "BiCMOS IC").

The operation speed and packaging density of bipolar ICs tend to increase more and more, and progress has been made in miniaturization techniques and self-alignment techniques, using selective oxide films as means for accomplishing these objects. On the other hand, in using such selective oxide films for accomplishing such objects, problems have occurred in that the production process becomes more complicated and the breakdown voltage drops. These problems are discussed in "Nikkei Electronics", 1983, June 20, pp. 179–207, published by Nikkei-McGrawHill Co.

SUMMARY OF THE INVENTION

The inventor of the present invention has found that the same tendency is likewise observed in a BiCMOS IC where bipolar IC and CMOS IC co-exist on one semiconductor substrate (semiconductor chip), and there is a limit to the breakdown voltage of the bipolar transistors (of the bipolar IC), in particular, with miniaturization of the device.

In a BiCMOS IC, the base-collector junction breakdown voltage $BV_{CBO}$ of the bipolar transistor particularly determines the upper limit of the voltage of the IC. The existing BiCMOS ICs are produced by a production process using a 5 μm line width, and $BV_{CBO}$ in this case is at most 40 V. To further improve the breakdown voltage beyond this value, it is necessary to increase the radius of curvature of the base-collector junction of the bipolar transistor.

To eliminate the problems described above, it is an object of the present invention to improve the breakdown voltage of a semiconductor device wherein a CMOS IC and a bipolar semiconductor device coexist, without making the production process particularly complicated.

It is another object of the present invention to provide a semiconductor device wherein a bipolar semiconductor device which has a high breakdown voltage and is miniaturized and a MOS FET (Metal Oxide Semiconductor Field Effect Transistor) coexist.

It is another object of the present invention to provide a method of producing BiCMOS ICs that have a high breakdown voltage and a method of producing a miniaturized BiCMOS IC.

It is a further object of the present invention to provide a method of producing a high breakdown voltage BiCMOS IC through a simple production process.

These and other objects and novel features of the present invention will become more apparent from the following description when taken in conjunction with the accompanying drawings.

Generally, the present invention provides structure, including a bipolar device (e.g., a bipolar transistor) and a field effect transistor (e.g., MOS FET), and a method of forming such structure, whereby an impurity-containing semiconductor region is provided around the periphery of the base of the bipolar device (e.g., between the base and collector of a bipolar transistor), so as to prevent field concentration at a PN junction between the base and collector regions of bipolar device. More specifically, the present invention provides structure, and a method for forming such structure, whereby, in an integrated circuit including at least a bipolar IC and an MOS (Metal Oxide Semiconductor Field Effect Transistor) IC in one semiconductor chip, an impurity region for preventing field concentration is provided around the periphery of the base of the bipolar IC, e.g., between the base and collector contact regions. Such impurity region for preventing field concentration can be of the same conductivity type as that of the base or that of the collector contact region. Moreover, such impurity region for preventing field concentration can be formed at the same time as a channel stopper of the MOS IC, or by a different production step.

Among the inventions disclosed herein, the following will illustrate a typical example. However, the following is merely illustrative, and does not define the scope of the present invention, which scope is defined by the appended claims.

In a BiCMOS IC of the type wherein several island regions which are electrically isolated from one another are formed using a semiconductor oxide film and an isolation region or regions formed selectively on one main surface of one semiconductor substrate, a bipolar npn transistor is formed in one of these island regions and a CMOS IC having an n-channel MOSFET formed in a surface region of a p-well provided in the substrate is formed in one of the other of these island regions, a p-conductivity type region for a channel stopper is formed around the periphery of the n-channel MOSFET described above, and a p-conductivity type region for preventing field concentration is formed around the periphery of a p-conductivity type region as the base region of the npn transistor described above either simultaneously with, or by a different production process from, the production process of the p-conductivity type region for the channel stopper.

According to the means described above, the breakdown voltage $BV_{CBO}$ of the bipolar semiconductor device portion can be improved effectively without changing drastically the conventional production process of the MOS IC, and the objects described above can thus be accomplished.

DESCRIPTION OF THE PREFERRED EMBODIMENTS

Figure 1:
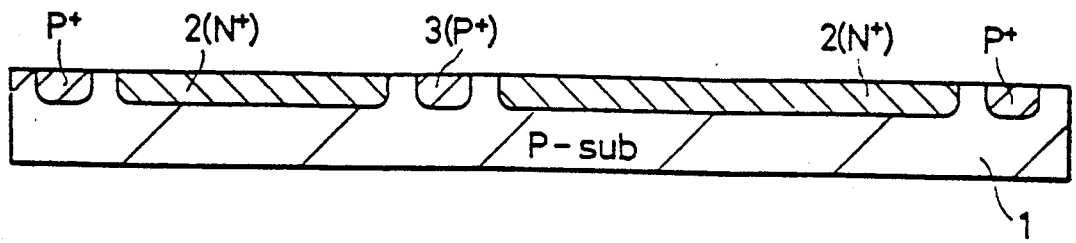
FIGS. 1–8 are section views, each showing step-wise the production process of a BiCMOS IC in accordance with a first embodiment of the present invention, with FIGS. 1–8 being sectional views from one side of the BiCMOS IC.

Before the detailed description of the present invention, a detailed description will be given about the impurity-containing region (hereinafter, impurity region) for preventing field concentration for improving the breakdown voltage of the bipolar transistor in a BiCMOS IC of the type wherein the bipolar transistors such as a bipolar npn transistor and/or a bipolar pnp transistor and MOS FET are formed on the same substrate.

Breakdown occurs when a large backward voltage is applied between the base and collector, between the base and emitter and between the emitter and collector of the bipolar transistor. Fundamentally, this phenomenon results from the avalanche phenomenon.

When a backward voltage is applied across the PN junction and is gradually increased, the so-called "breakdown" phenomenon, where a backward current increases drastically, occurs from a certain voltage. Such a phenomenon occurs because a field intensity is extremely great in a space charge region, and its mechanism includes "avalanche breakdown" and "zenor breakdown".

In avalanche breakdown, the electrons in the semiconductor on the P side are accelerated by a strong field in the space charge region while they move from the P side to the N side, impinge against the electrons forming the covalent bond of the crystal, strike them out from the crystal by their large kinetic energy and generate the movable electrons, that is, the electrons as the carriers. In connection with the energy band structure, the kinetic energy of the electrons due to the field pulls up the electrons of the full band to the conduction band and the conduction electrons generated afresh repeat the same in the high field so that the number of the conduction electrons increases in avalanche. This is called the "avalanche effect", and the voltage that abruptly increases the backward current is called the "avalanche breakdown voltage".

This voltage restricts the base-collector backward breakdown voltage and the base-emitter backward breakdown voltage. The avalanche phenomenon occurs due to the multiplication effect of carriers in the depletion layer when the maximum field intensity in the depletion layer caused by the impressed backward voltage exceeds the avalanche field intensity of the crystal. This value depends on the material of the single crystal and on its impurity concentration (specific resistance).

Like the Townsend's formula of gas discharge, the following formula can be established with M representing the multiplication coefficient and $\alpha$ the ionization coefficient:

$$1 - \frac{1}{M} = \int_0^{Xm} \alpha i dx \qquad (1)$$

where: Xm is the thickness of the depletion layer.

As this integration value approaches to 1, the multiplication coefficient M approaches infinity and means avalanche breakdown. Therefore, the conditional formula of avalanche is as follows:

$$\int_0^{Xm} \alpha i dx = 1 \qquad (2)$$

Accordingly, the relationship between the impurity concentration of the crystal and its breakdown voltage can be determined from the formula (2) when the form of junction and the field distribution are determined by assuming the field dependence of the ionization coefficient.

On the other hand, current concentration occurs at the end portion of the PN junction between the base and collector of a bipolar transistor having a planar structure due to the curve of the junction surface, and avalanche breakdown occurs more rapidly there than at the flat portion of the PN junction and reduces the breakdown voltage.

Therefore, the impurity region for preventing the field concentration of the present invention which is to be disposed in order to obtain a high breakdown voltage is formed at the curved portion of the PN junction such as between the base and collector, and the breakdown voltage is increased by increasing the radius of curvature or changing the impurity concentration.

A more general description will be given with respect to a BiMOS IC having a bipolar npn transistor and a MOS FET that are formed on the same substrate, describing specific aspects of the present invention.

In a bipolar transistor of a BiMOS formed on a single semiconductor substrate, the impurity region for preventing the field concentration, which is disposed in order to improve the breakdown voltage $BV_{CBO}$ of the bipolar npn transistor, can improve the breakdown voltage $BV_{CBO}$ between the collector and base if it is a p-type region which is deeper than the p-type base region and whose impurity concentration is greater than that of the p-type base region.

Moreover, in a bipolar transistor of a BiMOS formed on a single semiconductor substrate, the impurity region for preventing the field concentration, which is disposed in order to improve the breakdown voltage of the bipolar npn transistor, can improve the breakdown voltage between the collector and base if it is a p-type region which is shallower than the p-type base region and whose impurity concentration is smaller than that of the p-type base region.

In one embodiment of the present invention, boron is ion-implanted into an $n^-$-epitaxial layer to form the field concentration prevention impurity region in the same process step as the impurity region for the channel stopper. The field concentration prevention impurity region has a surface impurity concentration of atoms of about $2 \times 10^{17}$ atoms/cm$^3$ on the surface of the $n^-$-type epitaxial layer, whereas the p-type base region of the npn transistor has a surface impurity concentration of atoms of about $22 \times 10^{18}$ atoms/cm$^3$ on the surface of the $n^-$-type epitaxial layer.

FIGS. 1-8 show one embodiment of the present invention and are sectional views which show step-wise BiCMOS IC including a bipolar npn transistor and CMOS FET on one semiconductor substrate. Hereinafter, BiCMOS IC and its production method as one embodiment of the present invention will be described with reference to FIGS. 1-8.

(1) First of all, a $p^-$-type silicon substrate (e.g., a body of silicon) 1 is prepared as a substrate and ion implantation of an impurity is effected into the surface of the substrate in order to form an $n^+$-type buried layer 2 and a $p^+$-type buried layer 3 for forming an isolation layer for the PN junction (FIG. 1). Antimony (Sb) is used for forming the $n^+$-type buried layer 2 while boron (B) is used for forming the $p^+$-type layer 3, and a selective introduction technique, as is known in the art, is used in either case.

Figure 2:
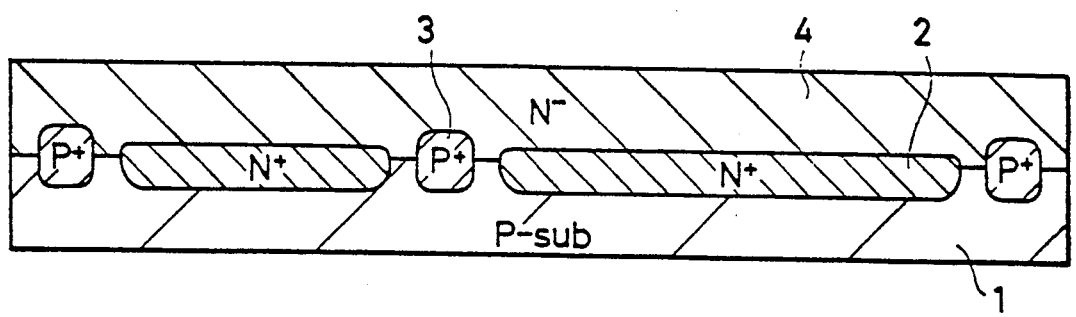

(2) A thick n⁻-type epitaxial layer 4 is formed on the entire surface by a known epitaxial technique so that the n⁺-type buried layer 2 is buried and the diffusion impurity of the p⁺-type layer 3 is caused to flow up into the n⁻-layer (epitaxial layer) 4 to form an isolation layer (FIG. 2).

(3) Boron (B) ions are implanted from the surface of the n⁻-type epitaxial layer 4 and then diffused, as known in the art, to form a p⁺ region 5 for the isolation layer in order to form an island region I for forming a bipolar device formation area and an island region II for forming a CMOS FET formation area.

Figure 3:
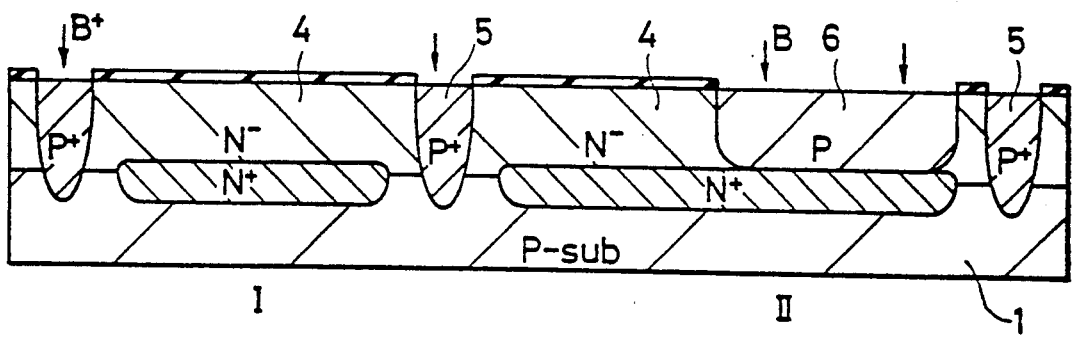

A p-well 6 is formed at part of the island region II in order to form n-channel MOS FET (FIG. 3).

Figure 4:
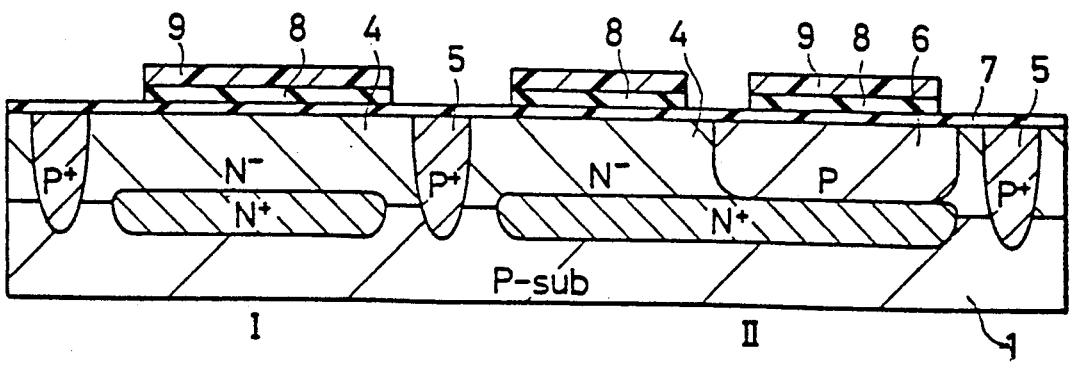
Figure 5:
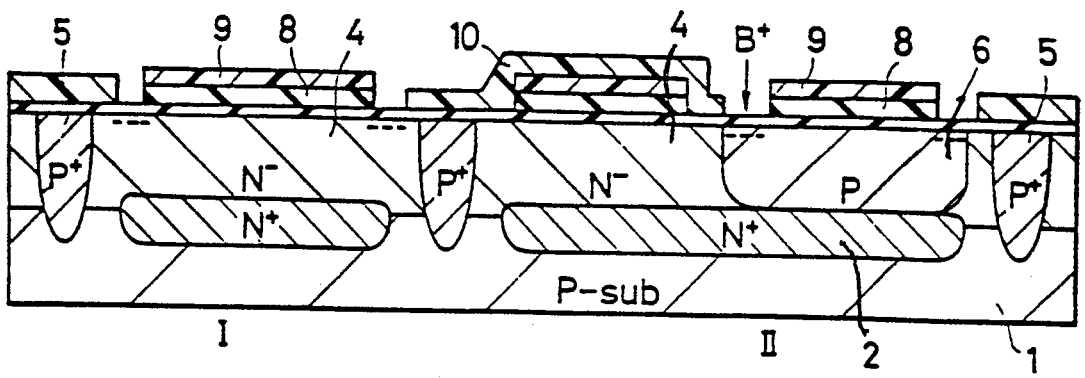

(4) A silicon nitride (SiN) film 8 as the mask for selective oxidation is formed selectively on the surface of the n⁻ epitaxial layer 4 through a thin silicon dioxide film 7 by use of a photoresist 9 as the mask for selective etching (FIG. 4).

(5) A mask 10 consisting of the photoresist for forming a channel stopper around the periphery of the N-channel MOS FET and a mask 10 consisting of the photoresist for forming the impurity region for preventing the field concentration around the base of the npn transistor are formed in the same process steps. Such mask 10 does not extend past the edge of p-well 6 that extends to the main surface of the epitaxial layer 4. Boron (B) ions are then introduced (e.g., implanted) using the mask 10 consisting of the photoresist and the silicon nitride film 8 described above as the mask for impurity introduction (FIG. 5).

Figure 6:
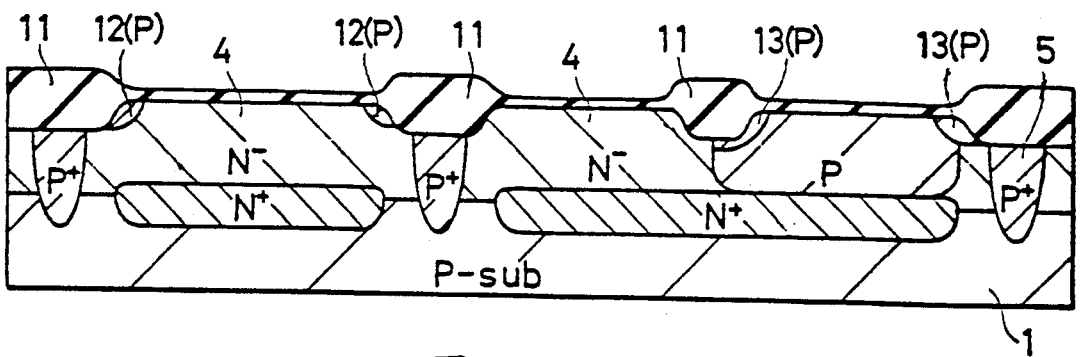

(6) Thereafter, the photoresist of the mask 10 is removed, Then, selective oxidation treatment is carried out to form a thick silicon dioxide film 11 having an LOCOS (Local Oxidation of Silicon) structure. As illustrative of this selective oxidation treatment, the oxidation can be performed at 1000° C., for about 30 minutes in an atmosphere of (N₂/O₂) gas and then for about 150 minutes in an atmosphere of (H₂/O₂) gas, to provide LOCOS structure having a thickness of 6500 Å±500 Å. At this time, a p-region 12 for preventing the field concentration is formed simultaneously around the periphery of the thick silicon dioxide film 11 of the LOCOS structure in the region I and a p-region 13 for the channel stopper is formed around the periphery of the thick silicon dioxide film 11 of the LOCOS structure in the peripheral portion of the p-well 6 in the region II (FIG. 6).

Figure 7:
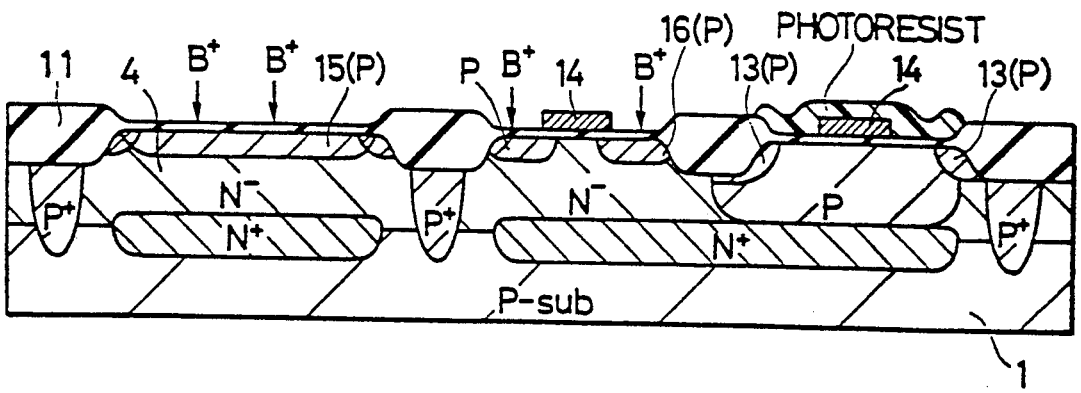

(7) A gate insulation film for the CMOS FET is formed on the surface of the region II and a gate electrode 14 is formed on its gate insulation film. Next, a p-region 15 as the base is formed by a known self-alignment technique in the surface region of the n⁻-epitaxial layer of the region I and source-drain regions 16 for a P-channel MOS FET device is formed by a known self-alignment technique in a surface region of the n⁻-epitaxial layer of the region II (FIG. 7).

Figure 8:
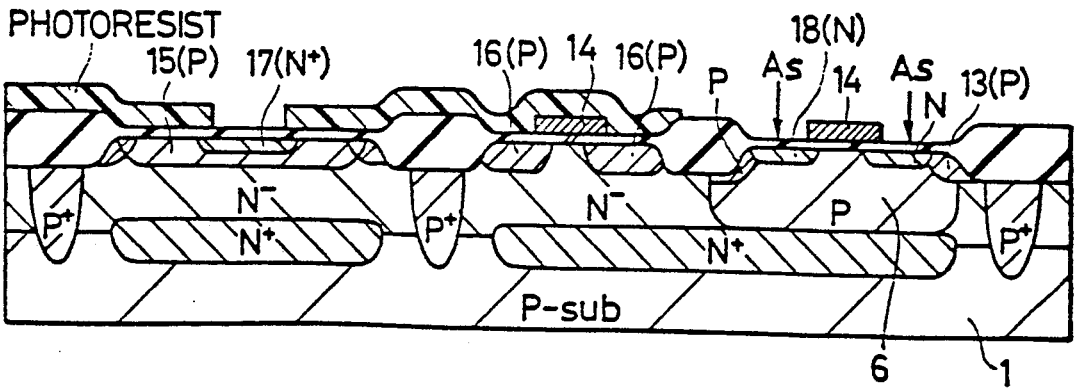

(8) An n⁺-region 17 for the emitter is formed by selective diffusion at part of the surface of the base of the region I, while an n-region 18 for the source and drain of the N-channel MOS FET device is formed by a known self-alignment technique in a surface region of the p-well 6 of the region II (FIG. 8).

Figure 9:
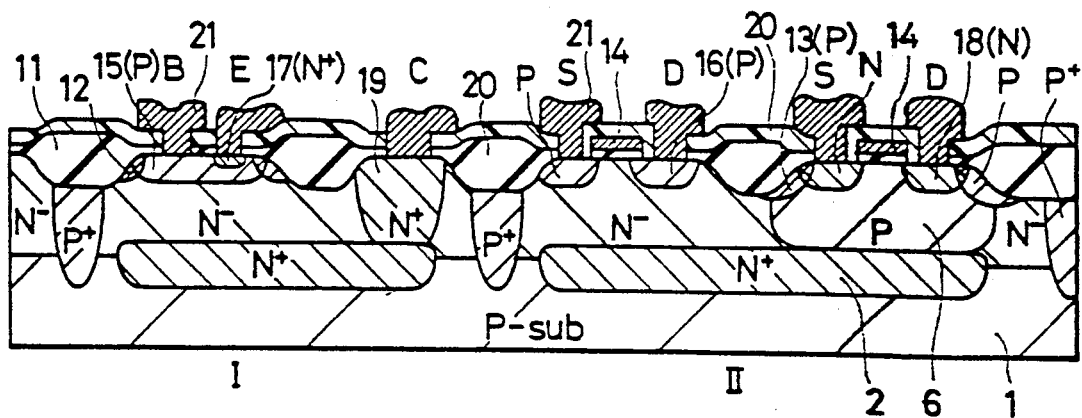
FIG. 9 is a sectional view of a completed BiCMOS IC in accordance with the first embodiment of the present invention, FIG. 9 being a sectional view from an adjacent side of the IC to the side shown in FIG. 8.

(9) Thereafter, an n⁺-region 19 for taking out a collector contact electrode is formed in adjacent regions using the n⁺-buried layer 2 of the region I in common, as shown in FIG. 9. Finally, a passivation film 20 consisting of SiO₂, PSG (phosphosilicate glass) or the like, formed by CVD, is applied, and photoetching is effected to form contact holes for electrodes, and the electrodes and wirings of each device are formed through vacuum deposition of aluminum (Al) and wiring patterning steps in order to form the electrodes and wirings 21 of each device. Thus, a BiCMOS IC is complete.

A BiCMOS IC, in which the bipolar npn transistor and CMOS FET including the N-channel MOSFET and P-channel MOS FET coexist, and which is produced in the manner described above, provides the following effects.

(1) In the bipolar npn transistor, the p-region 12 is disposed around the periphery of the base-collector junction. Therefore, the radius of curvature becomes great at the surface portion of the base junction to eliminate the field concentration, and the breakdown voltage $BV_{CBO}$ of the bipolar portion can be drastically improved from the present value of 40 V to 100 V. This means that the BiCMOS and its production method can be applied to products whose voltage of use is 100 V.

(2) The p-region 12 around the periphery of the base-collector junction of the bipolar npn transistor can be formed simultaneously with the p-region 13 for the channel stopper of the N-channel MOS FET in the CMOS FET, so that it can be formed by only changing part of the mask pattern used in the conventional BiCMOS IC production process. This means that the process of the production method of the semiconductor device need not be made more complicated and the cost of production can be reduced.

(3) When the BiCMOS IC is formed by a miniaturization technique, the breakdown voltage of the bipolar transistor drops due to the shallow impurity region. However, since the present invention includes the impurity region for preventing the field concentration, it can improve the breakdown voltage of the bipolar transistor and can provide a semiconductor device having a high breakdown voltage even in the case of a BiCMOS IC produced by a miniaturization technique.

Figure 10:
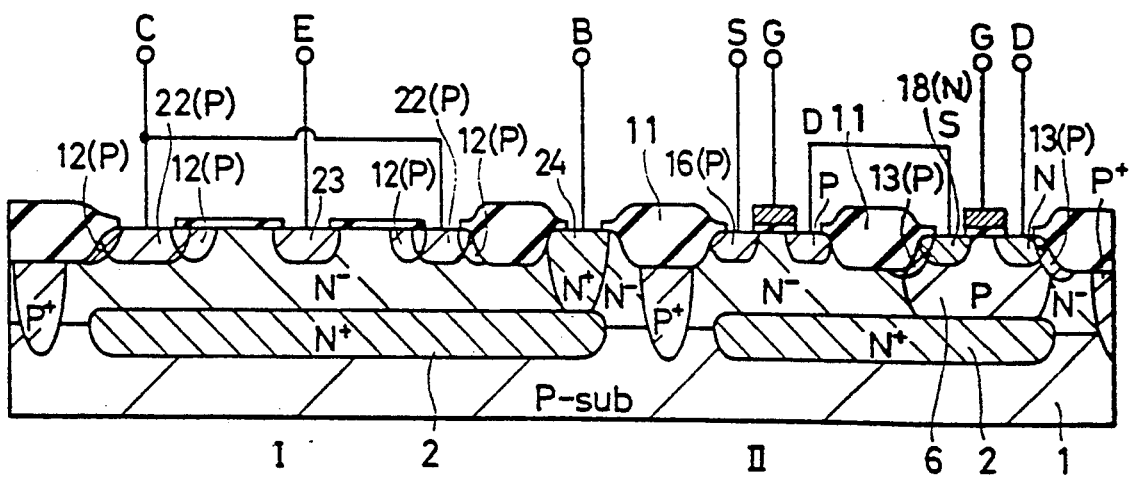
FIG. 10 is a sectional view of a BiCMOS IC having a lateral pnp transistor in accordance with another embodiment of the present invention.

FIG. 10 shows another embodiment of the present invention, and is a longitudinal sectional view of a BiCMOS IC wherein a lateral pnp transistor and CMOS FET coexist on one substrate.

In a region I, reference numeral 22 represents a p-region which is to serve as the collector of the lateral pnp transistor. A p-region 12 for preventing field concentration is disposed at the periphery of this collector p-region 22 in such a manner as to partially overlap a silicon dioxide film for isolation.

Reference numeral 23 represents a p-region which is to serve as the emitter and reference numeral 24 represents an n⁺-region which is to serve as a base contact electrode extension portion.

A P-channel MOSFET and an N-channel MOSFET are formed in a region II. They are the same as those shown in FIG. 9 representing the first embodiment of the present invention, and like reference numerals are used as in FIG. 9.

The p-region 12 for preventing the field concentration at the periphery of the collector p-region of the first region I is formed simultaneously with the channel stopper p-region 13 around the periphery of the N-channel MOSFET of the region II.

The breakdown voltage in such a semiconductor device can be improved by the p-region 12 for preventing field concentration which mitigates the breakdown phenomenon.

The present invention is not limited particularly to the embodiments described above, but can be changed or modified in various forms without departing from the spirit and scope thereof.

In the embodiments described above, in the BiCMOS IC having the bipolar transistor and CMOS FET formed on the same semiconductor substrate, the impurity region for preventing field concentration is formed simultaneously with the impurity region for the channel stopper of the CMOS FET in the BiCMOS IC in order to improve the breakdown voltage of the bipolar transistor. In other words, the foregoing embodiments deal with the case where the impurity region for preventing field concentration and the impurity region for the channel stopper are formed by the same production process. In this case, the shape and impurity concentration of the impurity region for preventing field concentration are limited to a certain extent by the impurity concentration of the ion implantation and the extension effect of the ion-implanted impurity by the heat treatment for forming the impurity region for the channel stopper.

Therefore, the impurity region for preventing field concentration having a desired shape and impurity concentration can be formed by forming it by a different production process from that for the impurity region for the channel stopper. In other words, where it is desired to set the breakdown voltage of the bipolar transistor to a predetermined value, the impurity region for preventing field concentration can be formed by a different production process from that of the diffusion layer for the channel stopper. For example, the formation of the mask for introducing selectively the impurity for forming the selective impurity region for preventing field concentration can be effected before or after the formation of the impurity region for the channel stopper. In this manner, it is possible to obtain the impurity region for preventing field concentration which is free in its shape and impurity concentration from the ion implantation of the impurity and the extension diffusion treatment of the impurity for forming the impurity region for the channel stopper. Accordingly, it is possible to provide a MOS IC and the bipolar transistor having a high predetermined breakdown voltage on the same substrate.

In accordance with the present invention, it is also possible to form the impurity region for preventing field concentration, which is for improving the breakdown voltage of the bipolar transistor, by the same formation process of the source or drain of a MOS FET which is formed on the same substrate as the bipolar transistor.

The foregoing embodiments illustrate the case where the impurity region for preventing field concentration, which is for improving the breakdown voltage of the bipolar transistor, is formed by the same or a different formation process as or from the formation process of the impurity region for the channel stopper of a CMOS FET in a BiCMOS IC including the bipolar transistor and CMOS FET formed on the same semiconductor substrate. However, in MOS ICs including semiconductor devices of the type wherein the bipolar transistor and MOS FET, which is not particularly limited to CMOS FET, are formed on the same semiconductor substrate, the present invention can be applied generally to those MOS ICs of the types wherein the impurity region for preventing field concentration is disposed in the bipolar semiconductor device, and can thus provide a semiconductor device having a high breakdown voltage. If the impurity region for preventing field concentration is disposed in the bipolar semiconductor device in this case, the impurity region for preventing field concentration can be formed in the bipolar semiconductor device simultaneously with the formation of the impurity region for forming the source or drain of the MOS FET in the formation process of the MOS FET or with the formation process of the impurity region for the channel stopper of the MOS FET. In this case, the breakdown voltage of the bipolar semiconductor device is limited by the impurity region for preventing field concentration. When the impurity region for preventing field concentration is formed simultaneously with the impurity region for forming the source or drain of a MOS FET, the formation process for the impurity region for forming the source or drain limits the breakdown voltage of the bipolar semiconductor device. Similarly, when the formation process of the impurity region for the channel stopper of a MOS FET is used, such formation process determines the breakdown voltage of the bipolar semiconductor device.

Accordingly, when the breakdown voltage of the bipolar semiconductor device is set to a desired value, the impurity region for preventing field concentration can be formed by adding the formation process of the impurity region to the formation process of a MOS FET without using the latter to form the impurity region. In this case, it is possible to form the impurity region for preventing field concentration, which is necessary for obtaining a desired breakdown voltage for the bipolar semiconductor device, independently of forming a source or drain of the MOS FET, and independently of forming a channel stopper of the MOS FET, and to obtain a MOS FET having a bipolar semiconductor device with a desired breakdown voltage on the same substrate.

In the region II in the foregoing embodiments, it is possible to form an n-well in the $n^-$-epitaxial layer in which the p-channel MOSFET is formed, and to further form an n-region for the channel stopper around the peripheral portion of the n-well.

The present invention is not particularly limited to BiCMOS IC having an isolation structure by a field insulation film of a LOCOS structure for PN junction separation, but can be applied to various types of BiMOS ICs having a dielectric isolation structure, for example.

Among the inventions disclosed herein, a typical example provides the following effect.

Namely, in a BiCMOS IC, the breakdown voltage of the bipolar transistor can be improved; and products having a high breakdown voltage, such as a voltage of use of 100 V, for example, can be provided.

The present invention can accomplish power ICs and industrial ICs which are miniaturized and yet have a high breakdown voltage.

Definite examples of BiCMOS ICs to which the present invention can be applied include BiCMOS ICs of various electric circuits such as switch regulators for VTR (video television recorder) power circuits, automatic white balancers for video cameras, controllers for floppy disks, and so forth.

While I have shown and described several embodiments in accordance with the present invention, it is understood that the same is not limited thereto but is susceptible of numerous changes and modifications as known to one having ordinary skill in the art and I therefore do not wish to be limited to the details shown and described herein, but intend to cover all such modifications as are encompassed by the scope of the appended claims.

What is claimed is:

1. A BiMOS semiconductor device comprising a plurality of island semiconductor regions isolated electrically from one another, the plurality of island semiconductor regions being isolated electrically from each other by first thick insulating oxide films, the plurality of island semiconductor regions being formed in one semiconductor substrate, with at least one bipolar transistor formed respectively in at least one of said island semiconductor regions and at least one MOS FET being formed in at least one of the other of said island semiconductor regions, each of the bipolar transistors having emitter, base and collector regions formed in their respective island semiconductor regions, the base region having a periphery with a PN junction formed between the base and collector regions, the PN junction having a curved portion, and with at least one of the bipolar transistors including an impurity region for preventing field concentration at the PN junction between the base and collector of said bipolar transistor, said impurity region being disposed around the periphery of the base region at a boundary portion between the base and collector regions, at the curved portion of the PN junction, said impurity region extending to a location adjacent an edge portion of at least one of the first thick insulating oxide films providing the electrical isolation, so as to reduce field concentration and increase breakdown voltage of the device.

2. A semiconductor device according to claim 1, wherein said at least one MOS FET includes at least one set of an N-channel MOS FET and a p-channel MOS FET that are coupled complementary with each other so as to provide a CMOS structure.

3. A semiconductor device according to claim 1, wherein said at least one bipolar transistor includes at least one npn transistor, and said at least one MOS FET includes at least one set of an N-channel MOS FET and a P-channel MOS FET that are coupled complementarily with each other so as to provide a CMOS structure.

4. A semiconductor device according to claim 1, wherein said curved portion extends to the main surface of the substrate, and said impurity region for preventing field concentration also extends to the main surface of the substrate, between the base and collector regions.

5. A semiconductor device according to claim 1, wherein said substrate comprises a body of semiconductor material having an epitaxial layer thereon, and wherein the at least one MOS FET includes source and drain regions formed in said epitaxial layer.

6. A semiconductor device according to claim 1, wherein said at least one bipolar transistor includes at least one npn transistor having a second thick insulating oxide film electrically isolating the base region thereof from a collector contact region thereof, and wherein said impurity region extends to a location adjacent an edge of said second thick insulating oxide film, the impurity region for reducing field concentration being a p-conductivity type region.

7. A semiconductor device according to claim 1, wherein said at least one bipolar transistor includes at least one pnp transistor having a second thick insulating oxide film electrically isolating a base contact extension thereof from the collector region thereof, and wherein said impurity region extends to a location adjacent an edge of said second thick insulating oxide film, the impurity region for reducing field concentration being a p-conductivity type region.

8. A semiconductor device according to claim 1, wherein said semiconductor substrate is a semiconductor body having an epitaxial layer thereon.

9. A BiMOS semiconductor device comprising a plurality of island semiconductor regions isolated electrically from one another, formed in one semiconductor substrate, the plurality of island semiconductor regions being isolated electrically from each other by first thick insulating oxide films, at least one bipolar transistor formed respectively in at least one of said island semiconductor regions and at least one MOS FET formed in at least one of the other of said island semiconductor regions, each one of the bipolar transistors having emitter, base and collector regions formed in their respective island semiconductor regions, and at least one MOS FET having a channel stopper formed around the peripheral portion of the MOS FET, each one of the bipolar transistors further comprising an impurity region, for reducing field concentration, which is disposed at a boundary between the base and collector of said bipolar transistor, the impurity region having a depth and an impurity concentration that are the same as that of the channel stopper, said impurity region extending to a location adjacent an edge portion of at least one of the first thick insulating oxide films providing the electrical isolation.

10. A semiconductor device according to claim 9, wherein said at least one MOS FET includes at least one set of an N-channel MOS FET and a P-channel MOS FET that are coupled complementarily with each other so as to provide a CMOS structure.

11. A semiconductor device according to claim 9, wherein said at least one bipolar transistor includes at least one npn transistor, and said at least one MOS FET includes at least one set of an N-channel MOS FET and a P-channel MOS FET that are coupled complementarily with each other so as to provide a CMOS structure.

12. A semiconductor device according to claim 9, wherein said at least one bipolar transistor includes at least one npn transistor having a second thick insulating oxide film electrically isolating the base region thereof from a collector contact region thereof, and wherein said impurity region extends to a location adjacent an edge of said second thick insulating oxide film, the impurity region for reducing field concentration being a p-conductivity type region.

13. A semiconductor device according to claim 9, wherein said at least one bipolar transistor includes at least one pnp transistor having a second thick insulating oxide film electrically isolating a base contact extension thereof from the collector region thereof, and wherein said impurity region extends to a location adjacent an edge of said second thick insulating oxide film, the impurity region for reducing field concentration being a p-conductivity type region.

14. A semiconductor device according to claim 9, wherein said semiconductor substrate is a semiconductor body having an epitaxial layer thereon.

15. A BiMOS semiconductor device comprising a plurality of island semiconductor regions isolated electrically from one another, the plurality of island semiconductor regions being isolated electrically from each other by first thick insulating oxide films, the plurality of island semiconductor regions being formed in one semiconductor substrate, with at least one bipolar transistor formed respectively in at least one of said island semiconductor regions and at least one MOS FET being formed in at least one of the other of said island semiconductor regions, each one of the bipolar transistors having emitter, base and collector regions formed in their respective island semiconductor regions, and with at least one of the bipolar transistors including an impurity region for reducing field concentration at a PN junction between the base and collector of said bipolar transistor, said impurity region being disposed at a boundary portion between the base and collector regions, said impurity region extending to a location adjacent an edge portion of at least one of the first thick insulating oxide films providing the electrical isolation, wherein said impurity region has a depth that is smaller than that of said base region, and wherein said impurity region has an impurity concentration that is smaller than that of said base region.

16. A semiconductor device according to claim 15, wherein said at least one MOS FET includes at least one set of an N-channel MOS FET and a P-channel MOS FET that are coupled complementarily with each other so as to provide a CMOS structure.

17. A semiconductor device according to claim 15, wherein said at least one bipolar transistor includes at least one npn transistor, and said at least one MOS FET includes at least one set of an N-channel MOS FET and a P-channel MOS FET that are coupled complementarily with each other so as to provide a CMOS structure.

18. A semiconductor device according to claim 15, wherein said semiconductor substrate is a semiconductor body having an epitaxial layer thereon.

19. A BiMOS semiconductor device comprising a plurality of island semiconductor regions isolated electrically from one another, the plurality of island semiconductor regions being isolated electrically from each other by first thick insulating oxide films, the plurality of island semiconductor regions being formed in one semiconductor substrate, with at least one bipolar transistor formed respectively in at least one of said island semiconductor regions and at least one MOS FET being formed in at least one of the other of said island semiconductor regions, each one of the bipolar transistors having emitter, base and collector regions formed in their respective island semiconductor regions, and with at least one of the bipolar transistors including an impurity region for reducing field concentration at a PN junction between the base and collector of said bipolar transistor, said impurity region being disposed at a boundary portion between the base and collector regions, said impurity region extending to a location adjacent an edge portion of at least one of the first thick insulating oxide films providing the electrical isolation, wherein said impurity region has a depth that is greater than that of said base region, and wherein said impurity region has an impurity concentration that is greater than that of said base region.

20. A semiconductor device according to claim 19, wherein said at least one MOS FET includes at least one set of an N-channel MOS FET and a P-channel MOS FET that are coupled complementarily with each other so as to provide a CMOS structure.

21. A semiconductor device according to claim 19, wherein said at least one bipolar transistor includes at least one npn transistor, and said at least one MOS FET includes at least one set of an N-channel MOS FET and a P-channel MOS FET that are coupled complementarily with each other so as to provide a CMOS structure.

22. A semiconductor device according to claim 19, wherein said semiconductor substrate is a semiconductor body having an epitaxial layer thereon.

23. A BiMOS semiconductor device comprising a plurality of island semiconductor regions isolated electrically from one another, the plurality of island semiconductor regions being isolated electrically from each other by first thick insulating oxide films, the plurality of island semiconductor regions being formed in one semiconductor substrate, with at least one bipolar transistor formed respectively in at least one of said island semiconductor regions and at least one MOS FET being formed in at least one of the other of said island semiconductor regions, each one of the bipolar transistors having emitter, base and collector regions formed in their respective island regions, and including a second thick insulating oxide film electrically isolating the base region from a collector contact region of the bipolar transistor, the base region having a periphery with a PN junction formed between the base and collector regions, the PN junction having a curved portion, and with at least one of the bipolar transistors including an impurity region for reducing field concentration at the PN junction between the base region and collector region of said bipolar transistor, said impurity region being disposed around the periphery of the base region at a boundary portion between the base and collector regions, at the curved portion of the PN junction, said impurity region extending to a location adjacent edge portions of the first and second thick insulating oxide films, so as to reduce field concentration and increase breakdown voltage of the device.

24. A BiMOS semiconductor device according to claim 23, wherein the first and second thick insulating oxide films include relatively thin portions adjacent relatively thick portions, the impurity region extending beneath the relatively thin portions, to an edge of the relatively thick portions.

25. A BiMOS semiconductor device according to claim 24, wherein the base region is positioned between the first and second thick insulating oxide films.

26. A BiMOS semiconductor device according to claim 25, wherein said impurity region is disposed such that a PN junction between the impurity region and collector region has a greater radius of curvature than a radius of curvature of edge portions of the PN junction between the base and collector regions so as to provide the increased breakdown voltage.

27. A BiMOS semiconductor device according to claim 25, wherein the at least one of the other island semiconductor regions, in which the at least one MOS FET is formed, is of a conductivity type the same as that of the base region of the at least one bipolar transistor.

28. A BiMOS semiconductor device according to claim 25, wherein the at least one of the other island semiconductor regions, in which the at least one MOS FET is formed, is a well region formed in the semiconductor substrate.

29. A BIMOS semiconductor device according to claim 23, wherein said semiconductor substrate is a semiconductor body having an epitaxial layer thereon.

30. A semiconductor device according to claim 1, wherein said impurity region is disposed such that a PN junction between the impurity region and collector region has a greater radius of curvature than a radius of curvature of edge portions of the PN junction between the base and collector regions, so as to provide the increased breakdown voltage.

31. A semiconductor device according to claim 1, wherein said impurity region is disposed at the boundary portion between the base and collector regions, so as to provide different impurity concentrations at a PN junction between the impurity region and collector region, or between the impurity region and base region, as compared to that at the PN junction between the base and collector regions, so as to provide the increased breakdown voltage.

* * * * *